United States Patent
Gatehouse

[19]

[11] Patent Number: 5,869,966
[45] Date of Patent: Feb. 9, 1999

[54] RADIO FREQUENCY COIL SWITCHING

[75] Inventor: Peter Gatehouse, London, United Kingdom

[73] Assignee: Royal Brompton Hospital, London, United Kingdom

[21] Appl. No.: 779,021

[22] Filed: Jan. 6, 1997

[30] Foreign Application Priority Data

Jan. 5, 1996 [GB] United Kingdom ............... 9600145

[51] Int. Cl.⁶ ........................................ G01V 3/00
[52] U.S. Cl. .............................. 324/322; 324/318
[58] Field of Search ............................. 324/318, 322, 324/314, 307, 309; 128/653.5

[56] References Cited

U.S. PATENT DOCUMENTS 5,545,999  8/1996  Mueller et al. .................. 324/318

*Primary Examiner*—Louis M. Arana
*Attorney, Agent, or Firm*—Watson Cole Grindle Watson, PLLC.

[57] ABSTRACT

In Magnetic Resonance Imaging Apparatus, it is necessary to switch the radio frequency electric coils which are positioned around the patient in the imaging volume very rapidly. The present invention achieves such switching using switching devices which are sensitive to control signals other than electrical signals. This removes the need to pass additional electrical conductors, which could carry interfering signals, into the imaging volume and this reduces image degradation. In particular the switching devices may be photodiodes which function in response to optical signals carried by optical fibres.

9 Claims, 2 Drawing Sheets

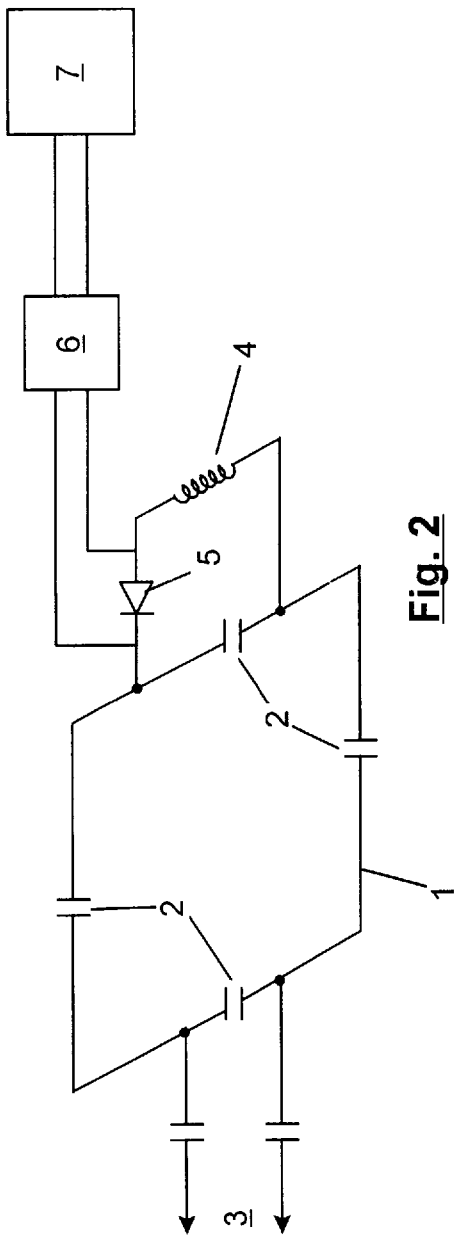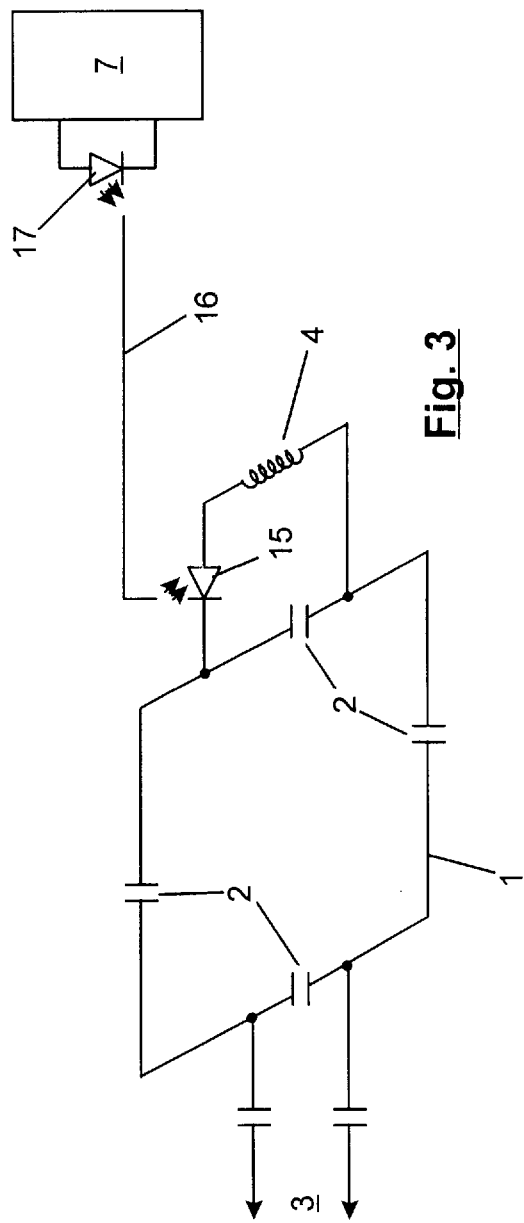

RADIO FREQUENCY COIL SWITCHING

BACKGROUND OF THE INVENTION

1. Field of the Invention

The present invention relates to the switching of electric coils used to emit and receive radio frequency energy, in particular in the field of magnetic resonance imaging (MRI) utilizing nuclear magnetic resonance (NMR).

This invention can be used in conjunction with one, some or all of the inventions described in our simultaneously filed applications entitled Magnetic Resonance Imaging of Fluid Flows, Phase Error Correction in Magnetic Resonance Imaging, Magnetic Field Measurement and Gradient Coils in Magnetic Resonance Imaging Machines.

2. The Prior Art

In MRI, a subject, for instance a live patient, is placed in a particular magnetic field and the hydrogen nuclei within the subject are excited by way of radio frequency (RF) energy. By sensing RF energy received back from the subject to detect resonances of the nuclei it is possible, given accurate knowledge of the magnetic field prevailing in the three-dimensional volume which contains the subject, to construct three-dimensional images of the internal structure of the subject.

To operate such apparatus to obtain proper images it is important firstly to be able to know accurately what the magnetic field is across the subject, and it is a well known technique to utilize magnetic field gradients so that the magnetic field varies constantly across the three-dimensional volume in question.

To perform the RF excitation and sensing mentioned above RF transmit and receive coils are provided. Both types of coil are tuned to the same frequency, i.e. that of the nuclear magnetic resonance. The transmit coil normally surrounds the patient, and the receive coil is placed over the region of the patient from which images are required, e.g. around the chest for heart imaging. The transmit coil and receive coil therefore have a large mutual inductance and the two resonant circuits are thereby coupled to each other and the resonance frequencies are shifted due to the coupling.

The amount and direction of the shift is quite unpredictable, depending on position, orientation, precise tuning and matching, patient size etc. making it practically impossible to use two such coils in this situation, unless the receiver coil is so small that the coupling is negligible.

In some previous systems, it has been possible to orient the two coils at right angles to each other to minimise the coupling, but this method cannot be used in particular if the transmitter coil is a quadrature coil. (A quadrature coil is more efficient than a single coil because it consists of two mutually orthogonal coils taking advantage of the minimised coupling between them. It generates a more powerful transmit R.F. field (with circular polarization) than a single coil (with either horizontal or vertical polarization).)

To remove the coupling effects the resonance of the unused coil is disabled at each stage in the imaging process. During the R.F. excitation of the NMR signal only the transmitter coil is enabled. During the data acquisition, only the receiver coil is enabled. The switching should be rapid, e.g. 100 microseconds or less, and reliable with feedback preventing the R.F. transmitter from delivering high R.F. power levels into the transmitter coil if the coil's resonance is disabled.

It is thus necessary to switch the various RF coils in and out of operation at various times during an imaging process, but it is also important to do this in such a way that the magnetic field, which is important for the imaging process, is not affected. For this reason the use of electrically operated switches to switch the RF coils can cause difficulties because they require the use of electric currents to operate them and if these are introduced into the vicinity of the subject they can affect the magnetic field around the subject.

The most common problem associated with conductors bringing such currents into the imaging volume is that they may bring in noise and unwanted signals (for example, short-wave radio stations) at the frequency of the NNR signal, which degrades the quality of the images. Conductors may carry in external noise and signals into the imaging volume, which is carefully shielded against such signals typically using a Faraday cage. This problem is especially difficult for the receive R.F. coil, which is the most sensitive part of the system. Conventional R.F. coil switching uses PIN diodes switched on by an external D.C. current. The cable carrying the D.C. PIN diode energisation signal must be carefully filtered to stop any signal at the NMR signal frequency, which filtering adds to the complexity of the overall apparatus.

SUMMARY OF THE INVENTION

The present invention therefore proposes the use of switches to switch the RF coils in and out of operation, the switches not requiring the application of electric current for their operation.

In particular the present invention proposes the use of light operated switches which can be operated remotely by the use of fibre optic cables.

The use of such switches enables the switching device to be located with the coil, that is in the vicinity of the subject to be imaged, while not introducing additional conductors potentially carrying unwanted magnetic fields into the vicinity of the subject.

In a preferred embodiment of the invention the particular photo-operated switches are PIN photodiodes which are particularly well adapted for operation in conjunction with the RF coils which typically are dealing with signals at approximately 21 MHz.

The use of switches according to this invention has advantages for MRI in that it assists the imaging process and the reconstruction of the image from the received data by reducing the uncertainty as to the exact magnetic field present and reducing background noise present in the received signals.

DESCRIPTION OF THE DRAWINGS

FIG. 2 is a schematic diagram of a typical prior art R.F. coil and its associated circuitry; and FIG. 3 is a schematic diagram of the arrangement of FIG. 2 altered in accordance with the present invention.

DESCRIPTION OF THE PREFERRED EMBODIMENT

Figure 1:
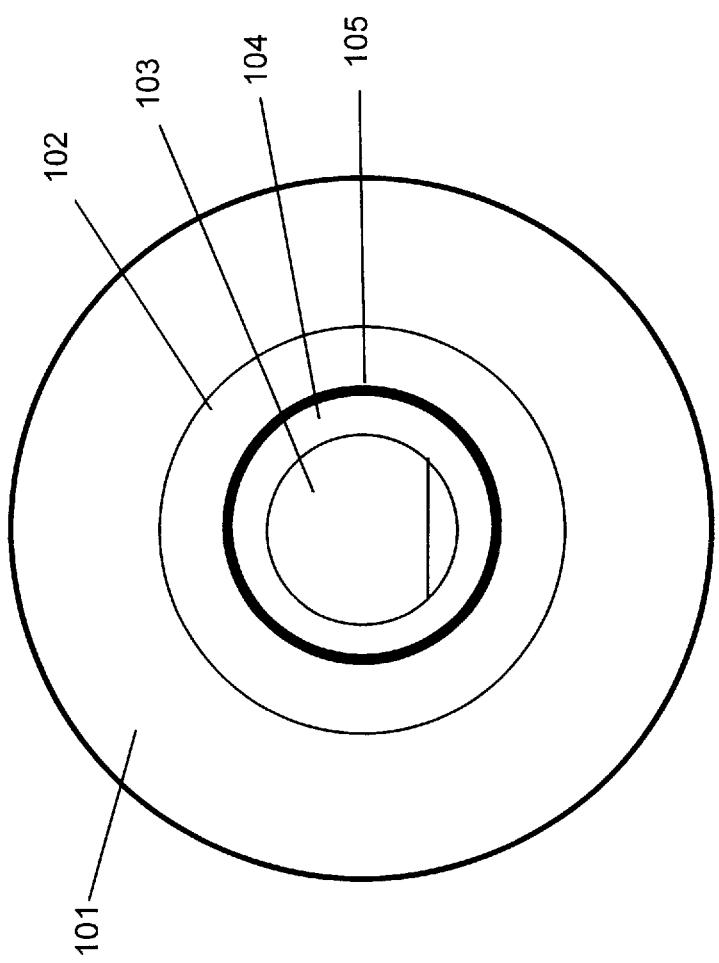
FIG. 1 is a schematic cross-sectional illustration of the principal components of MRI scanning apparatus.

MRI scanning apparatus is generally cylindrical in shape and is illustrated in cross-section in FIG. 1. The basic strong magnetic field is provided by a superconducting magnet 101 which is arranged to provide a very strong magnetic field in the region of the subject to be scanned. Typically this is achieved by providing a superconducting electro-magnet, having its windings immersed in liquid helium to maintain a very low temperature. Within the magnet 101 are located gradient coils indicated at 102. These gradient coils superimpose magnetic field gradients on the magnetic field generated by the magnet 101 so as to provide the varying fields required by the scanning process.

In the centre of the apparatus is the imaging volume 103 into which the subject, for instance the patient, is positioned during scanning. Surrounding this space are radio frequency (REF) transmitter coils shown by 104 which are used to generate the RF energy used in the imaging process. Resonances generated in the subject are received by RF receiver coils (not shown) which are typically positioned close to the patient. Finally, between the RF transmitter coils 104 and the gradient coils 102 is an RF shield 105. The purpose of this is to ensure that the subject under consideration and the RF coils are in an isolated RF environment, ie the only RF signals within the volume 103 are those generated by the transmitter coils 104 and induced in the subject under consideration and the signals do not leak out and interfere with the operation of the gradient coils.

FIG. 2 illustrates in schematic form, a receive R.F. coil for use in MRI, for instance in a machine as illustrated in FIG. 1. The coil is typically built into a curved plastic base but is illustrated flat for convenience. The RF coil comprises capacitors 2 joined by a copper loop 1. The diameter of the loop is typically 200 mm and capacitors 2 are tuned such that the combination of loop 1 and capacitors 2 resonates at, say, 21 MHz. The RF signal received by the coil is output to the processing circuitry as indicated by numeral 3.

There are further provided inductor 4 and PIN diode 5 connected in series, the combination being in parallel with one of capacitors 2. The inductance of inductor 4 is selected such that it resonates with capacitor 2 when diode 5 is "ON". The high impedance of this parallel resonance effectively breaks the copper loop 1 and prevents the RF coil from picking up the RF signals. When the diode is "OFF" inductor 4 is switched out of the circuit and the RF signals are received as mentioned above. The PIN diode 5 thus provides the required enabling and disabling of the resonance of the coil discussed above.

In the prior art arrangement of FIG. 2 the PIN diode 5 is a conventional PIN diode which is switched by the application of a dc signal. This signal is generated by the NMR pulse sequence computer 7 and is supplied to diode 5 by conductors after being filtered, for the reasons discussed above, by low-pass filter 6.

In the arrangement of FIG. 3, parts which are the same as those present in FIG. 2 are designated by the same reference numerals. PIN diode 5 is replaced by PIN photodiode 15. The output from NMR pulse sequence computer 7 is applied to a light source, schematically illustrated as LED 17. The light from the light source is conducted to PIN photodiode 15 by optical fibre 16.

Thus the same switching as in FIG. 2 is achieved but the electrical conductors taking the control signal to the diode have been eliminated, as has the filter 6. Therefore the disadvantages associated with the introduction of electrical conductors into the imaging volume are not present in this invention.

The particular connection of coil components and the diode in FIGS. 2 and 3 is given for illustrative purposes and many variations on the exact circuitry may be used with the present invention.

I claim:

1. Apparatus for enabling or disabling the operation of an electric coil comprising a switching device having two switching states and being electrically connected to said coil such that when said switching device is in a first switching state resonance of said coil is enabled and when said switching device is in a second switching state resonance of said coil is disabled, said switching device being sensitive to predetermined non-electrical control signals to switch between said two switching states;

control means arranged to generate said control signals in accordance with a required resonance of said coil; and connecting means arranged to carry said control signals from said control means to said switching device.

2. Apparatus according to claim 1 in which said switching device comprises a photodiode, said control means comprises a light source arranged to output said control signals in the form of light to which said photodiode is sensitive, and said connecting means comprises optical fibre means arranged to carry said outputted light to said photodiode.

3. Apparatus for enabling or disabling the resonance of an electric coil which coil comprises a plurality of capacitances connected in a loop and is tuned to a particular frequency, said apparatus comprising a switching device which is sensitive to predetermined non-electrical control signals and which comprises an inductance switchably connected, in response to said control signals, in parallel with at least one of said capacitances to disable or enable the resonance of the coil at said frequency;

control means for generating said control signals in accordance with a required resonance of said coil; and connecting means for carrying said control signals from said control means to said switching device.

4. Apparatus according to claim 3 in which said switching device comprises a photodiode, said control means comprises a light source for outputting said control signals in the form of light to which said photodiode is sensitive, and said connecting means comprises optical fiber means for carrying said outputted light to said photodiode.

5. In apparatus for conducting magnetic resonance imaging, comprising:

means for defining an imaging volume;

gradient electric coils for providing varying magnetic fields in said imaging volume;

R.F. coils for transmitting and receiving radio frequency signals in said imaging volume;

an electric insulator for carrying non-electric control signals for enabling or disabling the resonance of at least one of said transmit and receive coils.

6. Magnetic resonance imaging apparatus which comprises means for defining an imaging volume, gradient electric coils for providing varying magnetic fields in said imaging volume and transmitting and receiving R.F. coils for transmitting and receiving radio frequency signals in said imaging volume;

further comprising means for enabling or disabling the resonance of said receiving R.F. coil comprising a switching device having two switching states and being electrically connected to said receiving R.F. coil such that when said switching device is in a first switching state resonance said receiving R.F. coil is enabled and when said switching device is in a second switching state resonance said receiving R.F. coil is disabled, said switching device being sensitive to predetermined non-electrical control signals to switch between said two switching states.

7. Apparatus according to claim 6 in which said receiving R.F. coil comprises a plurality of capacitances connected in a loop and said switching device comprises an inductance switchably connected in parallel with at least one of said capacitances to disable or enable the resonance of the receiving R.F. coil.

8. Apparatus according to claim 7 in which said switching device comprises a photodiode, said control means comprises a light source for outputting said control signals in the form of light to which said photodiode is sensitive, and said connecting means comprises optical fiber means to carry said outputted light to said photodiode.

9. Apparatus according to claim 6 in which said switching device comprises a photodiode, said control means comprises a light source for outputting said control signals in the form of light to which said photodiode is sensitive, and said connecting means comprises optical fiber means to carry said outputted light to said photodiode.

* * * * *